United States Patent [19]

Dalman et al.

[11] Patent Number: 4,587,541

[45] Date of Patent: May 6, 1986

[54] MONOLITHIC COPLANAR WAVEGUIDE TRAVELLING WAVE TRANSISTOR AMPLIFIER

[75] Inventors: G. Conrad Dalman; Charles A. Lee, both of Ithaca, N.Y.

[73] Assignee: Cornell Research Foundation, Inc., Ithaca, N.Y.

[21] Appl. No.: 518,221

[22] Filed: Jul. 28, 1983

[51] Int. Cl.$^4$ .......................................... H01L 29/80
[52] U.S. Cl. ..................................... 357/22; 357/41; 330/277; 333/247
[58] Field of Search ............... 357/22, 51, 41, 23 MG; 330/286, 277; 333/246, 247, 204

[56] References Cited

U.S. PATENT DOCUMENTS

| | | |
|---|---|---|
| 2,744,970 | 8/1951 | Shockley . |
| 2,985,805 | 3/1958 | Nelson . |
| 3,100,838 | 6/1960 | Szekely . |
| 3,378,738 | 8/1965 | McIver . |
| 3,398,337 | 4/1965 | So . |
| 3,516,021 | 6/1970 | Kohn ..................................... 357/22 |
| 3,560,893 | 2/1971 | Wen ..................................... 333/116 |
| 3,634,702 | 1/1972 | Drangeld ............................. 357/22 |
| 3,663,873 | 1/1969 | Yagi . |
| 3,737,743 | 6/1973 | Goronkin ............................. 357/22 |
| 3,855,690 | 12/1972 | Kim et al. . |
| 3,943,622 | 10/1974 | Kim et al. . |
| 4,012,768 | 2/1975 | Kirk et al. . |
| 4,034,399 | 7/1977 | Drukier et al. ....................... 357/41 |
| 4,053,842 | 10/1977 | Turski et al. ......................... 330/277 |
| 4,065,781 | 6/1974 | Gutknecht . |
| 4,068,254 | 12/1976 | Erdi . |
| 4,092,660 | 9/1974 | Blocker, III . |
| 4,097,890 | 4/1977 | Morris et al. . |
| 4,106,044 | 5/1977 | Yoshida et al. . |
| 4,129,879 | 5/1978 | Tantraporn et al. . |
| 4,136,352 | 10/1976 | Moutou et al. . |
| 4,141,021 | 2/1977 | Decker . |
| 4,166,223 | 2/1978 | Bluzer . |
| 4,183,033 | 3/1978 | Rees . |
| 4,202,003 | 4/1978 | Darley et al. . |
| 4,204,218 | 3/1978 | Fox et al. . |
| 4,212,022 | 6/1975 | Beneking . |
| 4,222,164 | 12/1978 | Triebwasser . |
| 4,236,166 | 7/1979 | Cho et al. . |
| 4,249,190 | 7/1979 | Cho . |
| 4,254,430 | 1/1979 | Beneking . |
| 4,265,934 | 2/1978 | Ladd, Jr. . |
| 4,268,951 | 11/1978 | Elliott et al. . |
| 4,298,879 | 11/1981 | Hirano ................................. 357/81 |
| 4,504,796 | 3/1985 | Igarashi .............................. 330/286 |

FOREIGN PATENT DOCUMENTS 58-60575 4/1983 Japan ..................................... 357/22

OTHER PUBLICATIONS

IEEE Intl. Microwave Symposium Digest-Conference: Technology Growth for the 80's "Improved Elementary Cell GaAs Power FET Structure", by Pierre Baudet, 5/28/80.

Primary Examiner—Martin H. Edlow
Assistant Examiner—Mark Prenty
Attorney, Agent, or Firm—Jones, Tullar & Cooper

[57] ABSTRACT

A microwave and millimeter wave amplifier consisting of a field effect travelling wave transistor monolithically integrated into a coplanar waveguide having input, output and matching sections is disclosed. The amplifier consists of a semi-insulating substrate doped on its upper surface to form within an active region of the device a doping layer of predetermined conductivity type, such as an N type layer. At the lateral edges of the active region the N type material is further doped to produce N+ type regions for receiving source electrodes, while a central part of the active region is similarly doped to produce an N+ type region for receiving a drain electrode. A gate line having a bifurcated terminal end extends into the spaces between the drain electrode and the spaced source electrodes and forms junction contacts with the N type layer in the active region. A pair of ground lines extending the length of the substrate are formed as part of the two source electrodes, while the drain electrode is formed as part of a drain line. The gate and ground lines cooperate to form an input and an input matching structure, while the drain and ground lines cooperate to form a coplanar output transmission line. A major feature of the proposed amplifier structure is that all of the circuit elements and transistor elements are placed on the same surface to facilitate fabrication, thereby to obtain low cost and high performance.

16 Claims, 3 Drawing Figures

MONOLITHIC COPLANAR WAVEGUIDE TRAVELLING WAVE TRANSISTOR AMPLIFIER

BACKGROUND

The present invention relates, in general, to high frequency field effect transistors (FETs) and more particularly to an improved field effect travelling wave transistor monolithically integrated into a coplanar waveguide for amplification of microwave frequencies.

The use of extremely high frequencies, in the microwave range and above, in amplifiers, oscillators, and like circuits, both analog and digital, has been seriously limited by the poor performance of semiconductor devices such as field effect transistors. Such limitations in performance are due in large measure to the internal impedances, or "parasitics", associated with FETs at high frequencies, and numerous attempts have been made to design such devices in a way that will reduce these impedances.

Further difficulties have been encountered in attempting to provide input and output connections to FET amplifiers at microwave frequencies, for the connection points to the amplifier produce "lumped" impedances which are parasitic and which degrade the high frequency performance of the device. Thus, a lumped impedance at the connection between an input or an output line and the FET device produces undesirable reflections at microwave frequencies and reduces the frequency at which the device can be operated.

An early example of the use of FET devices in high frequency travelling wave amplifiers is U.S. Pat. No. 3,378,738 to George W. McIver, wherein an insulated gate FET is described. In that device, the gate and drain, which serve as input and output transmission lines, respectively, are located on a substrate with the gate overlying the source and being insulated therefrom. U.S. Pat. No. 4,141,021 to David R. Decker is a more recent patent directed to a field effect transistor device wherein the gate and source electrodes are on opposite faces of the active layer, and thus on opposite sides of the channel, to reduce parasitic impedances and to increase the frequency of operation. Other patents, such as U.S. Pat. No. 4,249,190 to Alfred Y. Cho, U.S. Pat. No. 4,129,879 to Tantraporn, U.S. Pat. No. 4,236,166 to Chao et al, and U.S. Pat. No. 2,985,805 to Nelson, also suggest the location of components of the transistor on opposite sides of a substrate in order to reduce parasitics. However, all of these devices are limited in performance at high frequencies by a relatively low incremental transconductance per unit width, and by the continued presence of significant parasitic impedances.

Many of the problems of parasitic impedance limitations in high frequency amplification were solved in a recent FET design developed by the present inventors and another, wherein the device was fabricated to include a semiconductor channel region with a source and a gate located on opposite faces of the channel. The source was of an effective length substantially less than that of the gate, and was located substantially symmetrically with respect to the gate. Two separate drains were located at opposite ends of the channel region and were parallel to each other. The incremental transconductance of the device per unit width was approximately twice that of a single conventional FET of similar design. Since transconductance has a significant effect on the high frequency performance of FETs, the device was capable of greatly improved high frequency operation.

In the preferred form of the above-referenced recent design, the source was formed as a buried semi-conductor region of a selected conductivity type within a nonconductive or semi-insulating substrate. The channel region was formed over the semi-insulating substrate, then drain regions of the same conductivity type as the source were formed at the ends of the channel, and gate and drain electrode metal was deposited on the upper face of the device. Contact with the source region was made by forming an opening in the substrate on the opposite face with respect to the gates and drains. A metalized layer making contact with the source also formed a ground plane. With this arrangement, it was found that the source resistance and inductance were practically eliminated, thereby contributing significantly to the high frequency performance of the device.

Although numerous improvements in operation and response characteristics were achieved by the foregoing design, it presented serious difficulties in fabrication, for construction of such a device requires precision work, including precise alignment of the lithography on opposite sides of a substrate. Techniques for accomplishing this with the precision required to fabricate such devices at reasonable cost do not exist.

SUMMARY OF THE INVENTION

It is, therefore, an object of the present invention to provide an improved high frequency transistor wherein the advantages of prior art FET devices are maintained while further providing a simplified construction that permits the use of conventional fabrication techniques.

Another object of the present invention is to provide a field effect transistor amplifier monolithically integrated into a coplanar waveguide for microwave frequencies.

It is a further object of the present invention to provide a monolithic field effect transistor structure which overcomes the problems of prior devices to reduce parasitics, to simplify the fabrication of the device, to facilitate interconnection with other circuit elements, and thereby to provide an improved microwave frequency amplifier device.

Briefly, the present invention is directed to a unique microwave and millimeter wave amplifier structure which consists of a field effect travelling wave transistor (FET) monolithically integrated into a coplanar waveguide having input, output and matching sections. A semi-insulating substrate, or wafer, is doped on its upper surface to form within an active region of the device a doping layer of a predetermined conductivity type such as, for example, an N type layer. At the lateral edges of that active region, the N type material is further doped to produce respective N+ type regions for receiving respective source electrodes, while a central portion of the active region is similarly doped to produce an N+ type region for receiving a drain electrode, thereby defining the FET portion of the amplifier structure.

The two source electrodes are formed as parts of two ground lines which extend the full length of the substrate, and are located on the lateral sides thereof. Each ground line includes a source electrode portion which extends into a corresponding side of the active region to form an ohmic contact with the N+ region on the corresponding lateral side of that region. The drain electrode is formed as a part of a drain line that is located along the longitudinal axis of the substrate, the electrode portion extending through the active region between the two source electrodes and extending toward the output end of the device. The drain line forms an ohmic contact with the central N+ portion of the active region.

Extending generally along the longitudinal axis of the substrate from the input end thereof, which is the end opposite to the drain line, is a gate line having a bifurcated terminal end, the two arms of which extend into the spaces between the drain electrode and the two laterally-spaced source electrodes. The bifurcated arms of the gate line form junction contacts with the N type layer of the substrate, and serve as gate electrodes. The source, gate and drain electrodes and lines all lie on the upper surface of the substrate, with the gate and ground lines cooperating to form a coplanar microwave input transmission line. The drain line and the ground line cooperate to form a coplanar microwave output transmission line. The source, gate and drain electrode configurations within the active region on the substrate form two parallel grounded emitter field effect travelling wave transistors.

The distance between the gate and ground lines on the input transmission line portion of the device and the spacing between the drain and ground lines and the output side of the transmission lines are tapered or stepped to provide input and output matching sections for the microwave signals. The entire structure is on a single surface of the substrate so as to provide a field effect travelling wave transistor amplifier monolithically integrated into a coplanar waveguide not only to facilitate fabrication of the device, but its connection by way of the waveguide lines to external circuits, thus making possible monolithic cascade structures which achieve very high gain over broad bandwidths.

BRIEF DESCRIPTION OF THE DRAWINGS

The foregoing and additional objects, features and advantages of the present invention will become apparent to those of skill in the art from a consideration of the following detailed description of a preferred embodiment thereof taken in conjunction with the accompanying drawings, in which.

DESCRIPTION OF A PREFERRED EMBODIMENT

Figure 1:
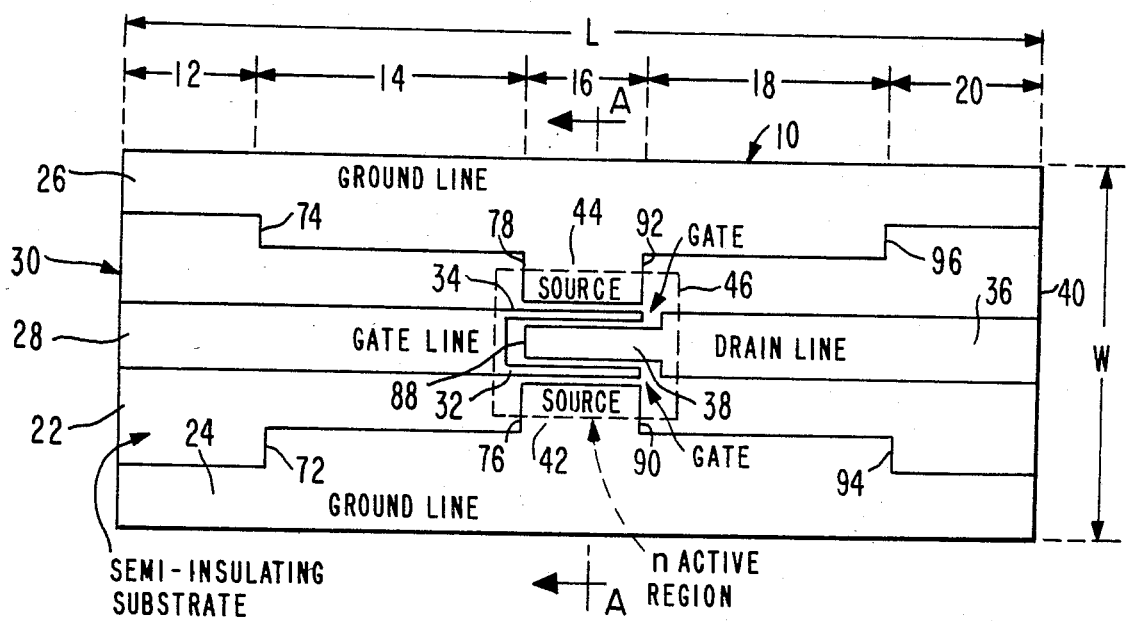
FIG. 1 is a top plan view of a monolithic, coplanar-waveguide travelling wave transistor amplifier constructed in accordance with the present invention.
Figure 2:
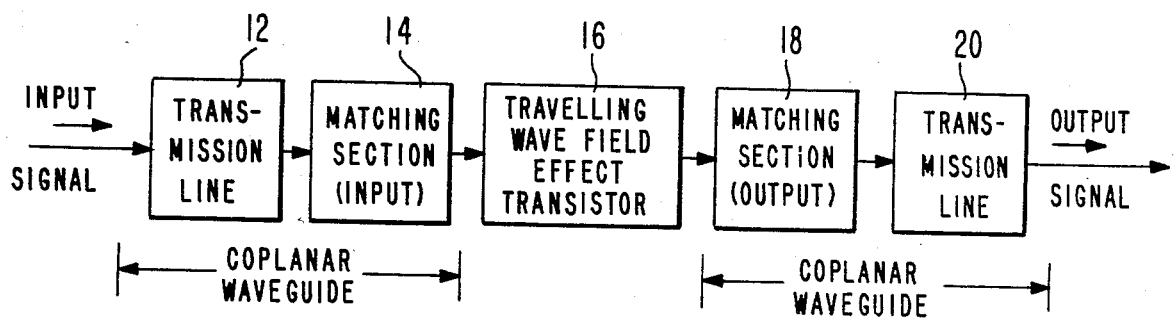
FIG. 2 is a block diagram of the amplifier of FIG. 1.

As shown in FIG. 1 and as diagrammatically illustrated in FIG. 2, the present invention comprises a monolithic amplifier device 10 having an input transmission line section 12, a matching input section 14, a travelling field effect transistor section 16 matching wave field effect transistor section 16, a matching output section 18, and an output transmission line section 20. The sections of the amplifier device 10 in FIG. 1 which correspond to the block diagram of FIG. 2 are similarly numbered. The device is carried on a suitable semi-insulating substrate wafer 22 which may be described as having a lateral dimension, or width W, and a longitudinal dimension, or length L.

Extending the length of the substrate 22, along opposite lateral edges of the top surface thereof, are first and second ground lines 24 and 26. Spaced from and located between the two ground lines on the surface of the substrate is an input gate line 28 which extends from the input end 30 of the device generally axially through the input portion of the device which includes the transmission line section 12 and the matching section 14. The distal end of the gate line 28 is divided into two spaced, parallel arm segments 32 and 34 which form corresponding gate electrodes in the FET section 16.

The ground lines 24 and 26 and the gate line 28 are secured to the top surface of the substrate 22 to form a coplanar waveguide segment which serves as the input and matching section of the amplifier. The coplanar segment preferably is formed of metal layers deposited on the substrate in accordance with conventional thin film semiconductor fabrication techniques to form a microwave frequency transmission line. The ground lines 24 and 26 are laterally spaced from the gate line section 28, being most distantly spaced at the input end 30 of the device, and being stepped inwardly closer to the gate line section at the interfaces between the segments 12 and 14 and 14 and 16 of the amplifier to provide, in the illustrated embodiment, a simple quarter-wave transformer acting as a matching section 14.

Deposited on the top surface of the substrate 22 is a drain line 36 which includes a drain electrode portion 38 extending from between the gate electrodes 32 and 34 toward the output end 40 of the amplifier device 10. The drain line is deposited generally along the longitudinal axis of the substrate and is applied through the use of conventional semiconductor fabrication techniques. The drain line cooperates with the laterally spaced ground lines 24 and 26 to form a coplanar waveguide output segment which includes the matching section 18 and the transmission line section 20. The ground line 24 and 26 taper or are stepped away from the axially located drain line 36 at the beginning and at the end of the matching section 18 to provide impedance matching between the FET section 16 and the output transmission line section 20. All of the lines and line segments lie on the top surface of the substrate 22 so as to provide a monolithic coplanar device.

In the FET section 16, the ground lines 24 and 26 are stepped inwardly to their closest approach to the gate line 28, the two inwardly extending segments 42 and 44 of lines 24 and 26, respectively, being extremely close to, but spaced laterally outwardly from, the legs 32 and 34, respectively, of the gate line. The two inwardly extending sections 42 and 44 serve as source electrodes for the travelling wave FET 16, as will be described.

Figure 3:
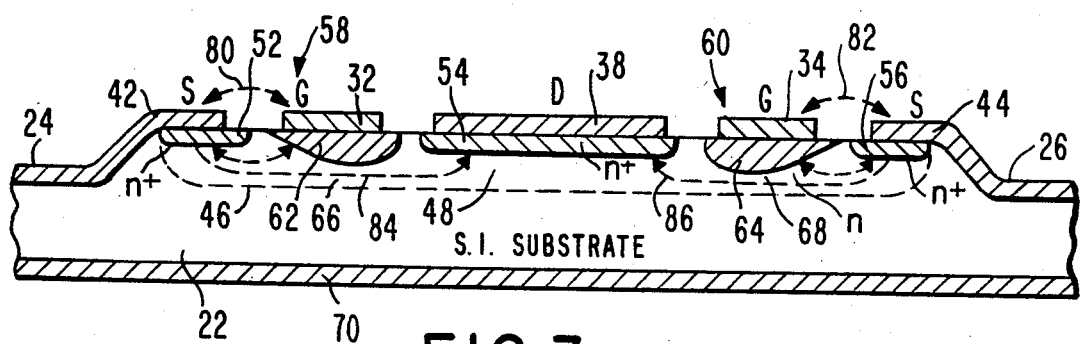
FIG. 3 is a cross-sectional view of the amplifier of the present invention taken along lines A—A of FIG. 1.

The area of the substrate 22 underlying the bifurcated leg portions 32 and 34 of the gate line, the source electrode portions 42 and 44 of the ground lines and the drain electrode 38 of the drain line 36 is doped to provide an active region 46 of a predetermined conductivity type. In the illustrated embodiment, the doping provides an N type active region in the area generally indicated by the dotted line at 46 in the illustrations of FIGS. 1 and 3. As shown in the cross-sectional view of the amplifier 10 in FIG. 3, the conductivity region 46 is produced by a doping layer 48 formed in the upper surface of the semi-insulating substrate 22. In one form of the invention, the substrate is a wafer of gallium arsenide (GaAs) approximately 200 micrometers thick selectively doped to produce a doping concentration of about $10^{17}/cm^3$ to a depth of 0.15 to 0.25 micrometers.

Conventional doping techniques are used such as ion-implantation through a window formed in a photoresist layer. Another photoresist layer may similarly be used to produce, by further ion implantation, three spaced conductivity regions 52, 54 and 56 on the upper surface of the doping layer 48 to form N+ type source, drain, and source regions, respectively. The N+ regions may be formed by any conventional photolithographic doping technique to produce, for example, a doping concentration of about $5 \times 10^{19}/cm^3$ in the N+ regions.

The N+ regions 52, 54 and 56 extend the length of the active region 46 and provide ohmic contacts for the source electrode 42, the drain electrode 38 and the source electrode 44, respectively. As previously described, the electrodes 32 and 34 extend between the source and drain electrodes within the active region 46, the gate electrode 32 extending between source 42 and drain 38 and electrode 34 extending between source 44 and drain 38. Although for clarity of illustration, the spacing between the source, gate, and drain electrodes is enlarged, in a preferred form of the invention, they are spaced sufficiently closely together to function as a pair of parallel field effect transistors, the source 42, gate 32 and drain 38 serving as a first FET 58 and the source 44, gate 34 and drain 38 operating as a second FET 60. In a preferred form of the invention, the gate electrodes 32 and 34 may be 0.25 micrometers long and the drain electrode 38 may be 100 micrometers long.

The semi-insulating substrate 22 may be mounted on a suitable metallic ground plane 70 and the coplanar lines 22, 26, 28 and 36 may be encapsulated in a suitable dielectric material (not shown), if desired, with a second optional ground plane (not shown) overlying the dielectric material for shielding purposes. However, the ground plane shields are not an integral part of the transmission line and amplifier of the present invention.

In the operation of the present amplifier device 10, conventional bias voltages are supplied between the gate and ground lines and between the drain and ground lines. The gate bias produces a first carrier depletion region 62 under gate electrode 32 and a second carrier depletion region 64 under gate electrode 34. The N type doping region 48 forms an active channel region 66 between the N+ source region 52 and the N+ drain region 54 within the doping layer 48. In similar manner, a channel region 68 is formed in the doping layer 48 between the N+ source region 56 and the N+ drain region 54. The gate electrodes 32 and 34 contact the channel regions 66 and 68, respectively. In conventional manner, the magnitude of the voltage applied to the gate electrodes controls the depth of the respective depletion regions 62 and 64, and thus controls the passage of charge carriers through the pinched off region of the channels 66 and 68 which extend between the bottoms of the corresponding depletion regions and the bottoms of the doping layers 48.

When an input signal is supplied to the input end 30 of the device by way of ground lines 24 and 26 and gate line 28, these lines serve as a coplanar wave guide on which the microwave frequency signal propagates along the the input transmission line portion 12, producing electric field lines between the ground and gate lines. The electric field is essentially confined to the surface of the substrate 22 and to the air or other dielectric overlying the device 10.

As the signals travel along the coplanar lines 24, 26 and 28, they are transformed in magnitude by the stepped portions 72, 74, 76 and 78 at the interfaces between the matching section 14 and the adjoining sections 12 and 16 (FIGS. 1 and 2). Although only two steps are shown in each of the lines 24 and 26, additional steps can be provided and their dimensions varied in accordance with the impedance matching required to cause the input signal to propagate along the gate line into the leg portions 32 and 34 with minimum reflections by the open-circuited terminal end of the gate line. The input signal is divided between the two electrodes 32 and 34 which preferably are coextensive with the source electrodes 42 and 44. The source-gate interfaces preferably are sufficiently long that the input signal is completely attenuated before it reaches the end; alternatively, the interfaces can be made short so that some of the signal is reflected. If desired, terminal impedances can be provided at the terminal ends of the gate legs to substantially eliminate reflections.

The electric field produced between the gate and ground lines in the transmission line and matching section by the input signal is propagated along the gate-source interfaces between gate electrode 32 and source electrode 42 and between gate leg electrode 34 and source electrode 44 in parallel. This electric field is illustrated diagrammatically by the dotted lines 80 and 82 in FIG. 3.

The source of D.C. bias voltage (not shown) connected between the drain line 36 and the two ground lines 24 and 26, respectively, produces a bias current flow through the active region 46 between the source electrode 42 and the drain electrode 38 by way of channel 66. This current is indicated by the dotted line 84. In similar manner, the bias voltage causes a bias current flow, indicated by dotted line 86, to flow between source electrode 44 and drain 38 by way of channel 68. The current flow through the channels 66 and 68 is controlled by the source-to-gate voltages produced by the alternating, microwave frequency input signal. This varying voltage modulates the size of the charge depletion areas 62 and 64, and thus modulates the amplitude of the current flow to the drain.

The flow of electrons from the source electrodes 42 and 44 to the drain 38 excites the drain electrode and launches an output current in the drain. The output current flow is controlled by the input wave as it propagates along the source-gate and gate-drain interfaces so that the output current is modulated thereby. The interfaces are designed so that their phase velocities are substantially equal, insuring the same phase velocity in the input and output currents. Accordingly, the current excited in the drain forms an output wave which is in synchronization with the input wave as the current propagates along the drain line toward the outlet end 40 of the device.

It should be noted that as electrons flow from the source electrode into the drain line, they would normally tend to flow both to the left and to the right in the drain electrode, as viewed in FIG. 1; that is, toward the open end 88 of the drain line and toward the outlet end 40 of the device. The signal which propagates toward the open end of the line can be reflected and used to enhance the signal flowing toward the output end (40) over a finite bandwidth. A terminating impedance can be placed at the open end 88 which absorbs the power flowing to the left. In this case, the bandwidth is greatly increased. The propagation of the output wave along the drain line toward the outlet end 40 in synchronization with the input wave continually adds current to the drain line in phase, and this coherent increase in current produces a power flow which is proportional to the square of the gate-drain interface length. This distributed interaction of the components of the travelling wave field effect transistor produces a significant advantage in the amplification provided by the device, and the distributed interaction along the length of the active region of the device overcomes the effect of parasitic impedances and improves the operation of the amplifier.

The signal excited in the drain electrode 38 flows into the output matching section 18 which includes first stepped portions 90 and 92 at the ends of the source electrodes 42 and 44, respectively, and second stepped portions 94 and 96 at the end of the matching section 18, whereby the output of the field effect transistor is impedance matched to the transmission line section 20. Again, the output matching section functions as a quarter wave transformer, but more complex and broader band matching structures can be provided as needed.

The output transmission line portion 20 includes the ground lines 24 and 26, which extend the full length of the device, and the axial drain line 36, with the drain line and ground lines providing, in effect, an output coaxial cable.

For the frequencies of interest in the present device, the spacing between adjacent source and gate electrodes and between adjacent drain and gate electrodes is between about 0.1 and 0.5 microns. This structure is adapted to amplify frequencies up to about 100 GHz when the substrate material is GaAs.

The present structure combines the features of a wave guide and a field effect transistor in a monolithic device, to make possible the fabrication of a microwave frequency amplifier having reduced parasitics and capable of being connected to other monolithic circuit elements, as well as being fabricated by means of currently available and well developed technology. The device permits effective control of the alternating drain current, and the interfaces between the source, gate and drain electrodes are so designed that the phase velocities of the excited wave in the drain line and in the input lines are practically equal. This enables the power to be transferred coherently to the output line and to enhance the overall efficiency of the device over a broad bandwidth, making possible the achievement of very high gain.

The device of the present invention can be fabricated using any known techniques, as previously indicated. Thus, the wafer 22 is mounted on the metal ground plane 70, the thickness of the wafer being sufficient to provide the necessary mechanical support for the amplifier. The top surface of the wafer is coated with a photoresist material, and a window area corresponding to the active region 46 is provided, using conventional photolithographic and etching techniques. Ion implantation techniques are used to dope the region 46, and the remaining photoresist material is removed. A second mask is applied to the top surface of the wafer by a similar photoresist and lithographic technique to provide windows through which additional doping may be done to produce N+ regions 52, 54 and 56. The second photoresist mask is then removed, and a third photoresist layer formed. Known lithographic techniques are again used to provide windows through which the metal electrodes and striplines may be applied to the surface of the wafer by, for example, vapor deposition. Removal of the last photoresist layer may be the last step of the process, although, as indicated, the entire top surface of the device may be encapsulated.

A major advantage of the disclosed structure is that all of the circuit elements and transistor elements are placed on the same surface of the supporting wafer to facilitate fabrication and to obtain high performance at low cost. If gallium arsenide is used as a material for the amplifier, performance in the millimeter wave range, i.e., up to 100 GHz, is achievable. If silicon is used, performance up to about 20 GHz can be obtained. Although in the latter case the lower mobility of the material reduces the performance as compared to the gallium arsenide material, very low-cost devices in the high frequency microwave range are still possible.

Although the invention has been disclosed in terms of a preferred embodiment, it will be apparent that numerous variations and modifications can be made without departing from the true spirit and scope thereof. The structure described herein lends itself to monolithic cascade operation, which makes it possible to obtain very high gain over broad bandwidths.

What is claimed is:

1. A monolithic coplanar waveguide travelling wave field effect transistor amplifier device, comprising:
   a substrate having on a first surface an active region of a first conductivity type;
   first, second, and third regions of a second conductivity type formed in spaced locations on said active region at said first surface of said substrate, said active region forming first and second channels between said first and second and said third and second regions, respectively;
   first and second ground lines on said first surface of said substrate spaced from said active region, said ground lines including first and second source electrode portions, respectively, extending onto and contacting said first and third regions;
   a drain line on said first surface spaced between said first and second ground lines, said drain line including an electrode portion extending onto and contacting said second region between said first and second source electrode portions; and
   a gate line on said first surface spaced between said first and second ground lines, said gate line including spaced terminal electrode legs extending onto and contacting said active region between said source electrode portions and said drain electrode portion to control the flow of current between said source electrode portions and said drain line, whereby an input signal supplied across said gate line and said first and second ground lines generates a corresponding output signal across said drain line and said first and second ground lines.

2. The device of claim 1, wherein said source, gate and drain electrodes are substantially parallel to each other and coextensive within, and along a longitudinal axis of, said active region to form two parallel field effect transistors.

3. The device of claim 2, wherein said first and second ground lines cooperate with said gate line to provide an input transmission line and matching section for connecting input signals to said field effect transistors.

4. The device of claim 2, wherein said first and second ground lines cooperate with said drain line to provide an output matching section and transmission line for receiving amplified signals from said field effect transistors.

5. The device of claim 1, wherein said gate electrodes are substantially coextensive with, and provide interfaces with, said source electrodes along a longitudinal axis of, and within, said active region of said substrate, said interfaces being sufficiently long to attenuate substantially completely an input signal before it reaches the terminal ends of said gate electrodes, to prevent signal reflection.

6. The device of claim 5, wherein said gate electrodes are substantially coextensive with, and provide interfaces with, said drain electrode within, and along said longitudinal axis of said active region of said substrate, said source-gate interfaces and said gate-drain interfaces having substantially equal phase velocities, whereby output signals generated in said drain electrode by input signals applied to said gate electrodes will be synchronized therewith to cause the output signals to increase coherently along said longitudinal axis to enhance the efficiency of the device.

7. The device of claim 1, wherein said ground lines cooperate with said gate line to provide an input transmission line, the spacing between said ground lines and gate line being varied to provide an input matching structure.

8. The device of claim 1, wherein said ground lines cooperate with said drain line to provide an output transmission line, the spacing between said ground lines and drain line being varied to provide an output matching structure.

9. The device of claim 1, wherein said first and second ground lines are spaced on opposite sides of said substrate, extend the length thereof from an input end to an output end, and pass on opposite sides of said active region.

10. The device of claim 9, wherein said gate line extends axially along said first surface between said first and second ground lines from said input end to said active region.

11. The device of claim 10, wherein said drain line extends axially along said first surface between said first and second ground lines from said active region to said output end.

12. A monolithic, coplanar amplifier device comprising:
a substrate having an upper surface and a lower surface;
an active region of a first conductivity type formed in and centrally located on said upper surface;
first and second regions of a second conductivity type located along first and second opposed side edges, respectively, of said active region;
a third region of said second conductivity type centrally located in said active region and spaced from said first and second regions to define a first channel within said active region between said first and third regions, and to define a second channel within said active region between said second and third regions;
first electrode means on said first surface overlying said first and second channels;
second electrode means on said first surface overlying said first and second regions;
third electrode means on said first surface overlying said third region, said first, second and third electrodes cooperating with said active region to form a field effect transistor;
input and output transmission line means on said first surface of said substrate;
first impedance matching means connecting said input transmission line means to said field effect transistor; and
second impedance matching means connecting said output transmission line means to said field effect transistor, said input and output transmission lines, said first and second impedance matching means, and said field effect transistor electrodes being coplanar and cooperating to form a microwave frequency travelling wave amplifier.

13. The amplifier device of claim 12, wherein said first, second and third electrode means comprise gate, source and drain electrodes of a field effect transistor.

14. The amplifier device of claim 12, wherein said electrode means are parallel to each other and extend longitudinally across said active region, the interfaces between said electrodes presenting equal phase velocities to microwave signals whereby output signals from said amplifier device are in phase with input signals applied thereto.

15. The amplifier device of claim 14, wherein said input transmission line means and said first impedance matching means comprise first and second spaced ground lines and a gate line between said ground lines, said ground and gate lines being located on said first surface, said source electrodes being connected to said first and second ground lines and said gate electrode being connected to said gate lines.

16. The amplifier device of claim 15, wherein said output transmission line means and said second impedance matching means comprise third and fourth spaced ground lines and a drain line therebetween, said ground and drain lines being located on said first surface, said source electrodes being connected to said third and fourth ground lines and said drain electrode being connected to said drain line.

* * * * *